United States Patent [19]

Kato

[11] Patent Number: 4,800,417
[45] Date of Patent: Jan. 24, 1989

[54] IMPROVED SEMICONDUCTOR DEVICE HAVING A POLYCRYSTALLINE ISOLATION REGION

[75] Inventor: Juri Kato, Suwa, Japan

[73] Assignee: Seiko Epson Corporation, Tokyo, Japan

[21] Appl. No.: 391,790

[22] Filed: Jun. 24, 1982

[30] Foreign Application Priority Data

Jun. 25, 1981 [JP] Japan .................................. 56-98602
Jun. 25, 1981 [JP] Japan .................................. 56-98603

[51] Int. Cl.⁴ ...................... H01L 29/04; H01L 27/12
[52] U.S. Cl. ...................................... 357/59; 357/49; 357/55
[58] Field of Search ...................... 357/59, 50, 48, 55, 357/49

[56] References Cited

U.S. PATENT DOCUMENTS

| | | | |
|---|---|---|---|
| 3,871,007 | 3/1975 | Wakamiya et al. | 357/59 |
| 4,140,558 | 2/1979 | Murphy et al. | 357/55 |
| 4,255,207 | 3/1987 | Nicolay et al. | 357/59 |
| 4,255,209 | 3/1981 | Morcom et al. | 357/48 |
| 4,272,776 | 6/1981 | Weijland et al. | 357/50 |
| 4,309,716 | 1/1982 | El-Kareh | 357/50 |
| 4,369,565 | 1/1983 | Muramatsu | 357/59 |
| 4,393,391 | 7/1983 | Blanchard | 357/55 |
| 4,409,609 | 10/1983 | Fukuda | 357/59 |

Primary Examiner—J. Carroll
Attorney, Agent, or Firm—Blum Kaplan

[57] ABSTRACT

In an improved metal-oxide-semiconductor (MOS) device a polycrystalline semiconductor region is buried in a monocrystalline semiconductor substrate at the isolation region between elements of the device. A deep and narrow groove of about 1 μm is formed by reactive ion etching in which the polycrystalline silicon is deposited by chemical vapor deposition. Surface polycrystalline semiconductor is removed by etching resulting in only the polycrystalline semiconductor buried in the substrate which is implanted with ions. Alternatively, polycrystalline semiconductor is deposited only in the bottom portion of the groove, ion implanted and an insulator film is formed in the remaining portion of the groove for fully isolating the polycrystalline region. Semiconductor devices prepared in accordance with the invention have flattened surfaces, reduced crystal defects and permit further miniaturization of the MOS devices.

4 Claims, 2 Drawing Sheets

IMPROVED SEMICONDUCTOR DEVICE HAVING A POLYCRYSTALLINE ISOLATION REGION

BACKGROUND OF THE INVENTION

This invention relates to a metal-oxide-semiconductor (MOS) device, and in particular an improved MOS device wherein a polycrystalline semiconductor region is buried in a monocrystalline semiconductor substrate at an isolation region between elements of the device.

In conventional MOS devices, the isolation regions between elements are generally formed by selective oxidation of the substrate. However, such conventional devices formed by selective oxidation of the substrate exhibit disadvantages which prohibit further miniaturization of the devices. Specifically, an unevenness of the surface of the semiconductor device occurs which results in crystal defects of the devices.

Generally, in accordance with the prior art, after field ion implanation, an oxide film layer is selectively formed by thermal oxidation utilizing a silicon nitride mask in order to isolate the MOS elements. These devices in accordance with the prior art exhibit the following disadvantages.

1. Miniaturization of the semiconductor device is limited since the oxide film tends to migrate in the lateral direction during thermal oxidation. This oxide film then undercuts the silicon nitride film and the dimensional accuracy of the pattern is not maintained. This phenomenon is called the "bird's beak problem".

2. Further miniaturization of the semiconductor device is limited since the implanted field ions tend to migrate in a lateral direction during thermal oxidation.

3. Surface smoothness is reduced since the oxidized portion tends to thicken on the thermally oxidized semiconductor substrate. 4. The electrical chracteristics deteriorate since the cyrstal defects occur at the substrate at the end of the silicon nitride film at the time of thermal oxidation. Accordingly, it would be desirable to provide an MOS device which did not suffer from these defects.

SUMMARY OF THE INVENTION

Generally speaking, in accordance with the invention, an improved MOS device wherein a polycrystalline semiconductor region between elements in the device is formed submerged in the monocrystalline semiconductor substrate is provided. The polycrystalline semiconductor region is formed in a deep and narrow groove having a width of about 1 μm formed in the monocrystalline semiconductor substrate. An insulating film region may be disposed over the semiconductor region in the groove beneath the surface of the substrate. This provides both a lower polycrystalline semiconductor region and an upper insulating film region submerged at the isolation region between elements in the monocrystalline semiconductor substrate. In the preferred embodiments of the invention the substrate is a monocrystalline silicon semiconductor and the polycrystalline semiconductor is a polycrystalline silicon semiconductor.

The improved MOS device wherein the polycrystalline semiconductor region is buried in the monocrystalline semiconductor substrate is formed by etching a groove in a monocrystalline semiconductor substrate. A polycrystalline semiconductor is disposed in the groove by chemical vapor deposition and any polycrystalline semiconductor formed on the surface of the monocrystalline substrate is removed by etching and n or p ions are implanted in the buried polycrystalline semiconductor region. The field ions of the isolation elements are then activated by instantaneous heating with a halogen lamp. The insulating film on the surface is then removed for providing a polycrystalline semiconductor region fully buried within the substrate and a region of high density diffused ions.

Accordingly, it is an object of the invention to provide an improved MOS device.

It is another object of the invention to provide an improved MOS device wherein a polycrystalline semiconductor region is buried in a monocrystalline semiconductor substrate.

It is a further object of the invention to provide an improved MOS device wherein a polycrystalline semiconductor region is buried in a monocrystalline semiconductor substrate at the isolation region between elements of the device.

Still another object of the invention is to provide an improved MOS device wherein a polycrystalline semiconductor region and an insulating film region are buried in the monocrystalline semiconductor substrate.

Yet another object of the invention is to provide an improved MOS device having a smoother surface, reduced crystal defects, strictly controlled paracitic capacatance and can undergo further miniaturization.

Still a further object of the invention is to provide an method for preparing an MOS device wherein a polycrystalline semiconductor region is buried in a groove in a monocrystalline semiconductor substrate.

It is another object of the invention to provide an method for preparing an MOS device wherein a polycrystalline semiconductor region and an insulating film region are buried in a groove in a monocrystalline semiconductor substrate.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
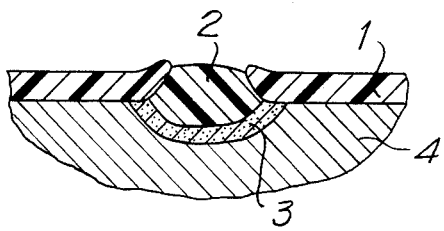
FIG. 1 is a cross-sectional view of an isolation region between elements of a conventional MOS device.

FIG. 1 is a sectional view of an isolation region between elements of the most simple construction of an MOS device in accordance with the prior art. A fixed silicon oxide film 2 of about 1 μm thickness has been selectively formed through thermal oxidation on a semiconductor substrate 4 with a silicon nitride film 1 as a mask after field ion implantation. An isolation region 3 between elements has been formed by ion implantation. In accordance with the process for preparing such an MOS device in accordance with the prior art, the dimensional accuracy of the pattern is imprecise and further miniaturization of semiconductor devices including such elements is difficult. Silicon oxide film 2 tends to migrate or spread out in the lateral direction during thermal oxidation and silicon oxide film 2 tends to undercut silicon nitride film 1 as illustrated. Additionally, field ions of isolation element 3 also tend to migrate due to thermal diffusion. Additionally, thermal oxidation of substrate 4 tends to result in crystal defects and in an unevenness of the surface of substrate 4 since the selectively oxidized portion is thicker than the remaining portions.

A semiconductor device prepared in accordance with the invention wherein the polycrystalline semiconductor region is submerged in the substrate in the isolation region between elements avoids the above-mentioned disadvantages of the prior art constructions. The MOS device prepared in accordance with the invention will now be described in connection with the examples illustrated in FIGS. 2 and 3.

Referring specifically to FIG. 2, the sequence of steps for preparing an MOS semiconductor device in accordance with the invention is shown. FIG. 2(d) is a sectional view of an isolation region 10 between elements wherein the polycrystalline silicon is buried in the isolation region between elements. As shown in FIG. 2(a), a narrow groove 16 has been formed in an n or p monocrystalline silicon substrate 11. Narrow groove 16 has a width of about 1 μm in thickness and may be formed by various etching techniques. For example, deep and narrow groove 16 may be formed by reactive ion etching or sputter-etching by means of a parallel-plane anisotropic ion etching device, reactive ion-beam etching or ion-beam etching by means of an ion gun. Since anisotropic etching can be performed in accordance with the reaction between the reactive ion having a unidirectional property and the semiconductor substrate, the substrate is not undercut. Thus, a narrow groove of about 1 μm can be formed below the surface of substrate 11.

Figure 2A:
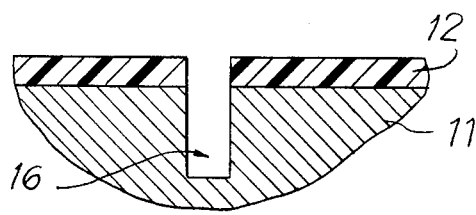
FIGS. 2(a)-(d) illustrate in cross-section the sequence of steps of preparing a MOS device wherein a polycrystalline semiconductor region is submerged in a groove in a monocrystalline semiconductor substrate in accordance with a first embodiment of the invention.
Figure 2B:
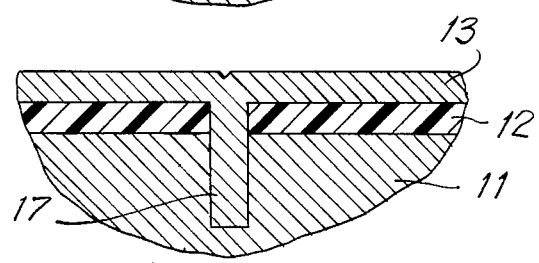
Figure 2C:
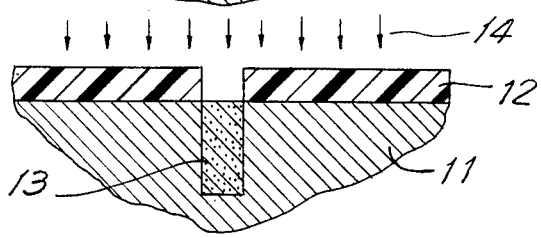

A silicon nitride film 12 was deposited on the surface of substrate 11 prior to etching. Thus, polycrystalline silicon 17 can be deposited beneath the surface of substrate 11 within narrow groove 16 by chemical vapor deposition. Any polycrystalline silicon 17 which forms on the surface of silicon substrate 11 may be removed by etching so that only polycrystalline silicon 17 beneath the surface of substrate 11 remains as illustrated in FIG. 2(c). Following removal of polycrystalline silicon 17, n or p ions are implanted into polycrystalline silicon 17 by utilizing silicon nitride film 12 as a mask as it has the same pattern of that of groove 16 on the surface of silicon substrate 11.

Figure 2D:
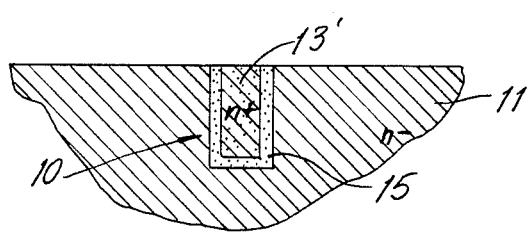

Field ions for isolation of the elements are activated by instantaneous heating with a halogen lamp. Silicon nitride film 12 is then removed. This results in a construction as illustrated in FIG. 2(d) wherein polycrystalline silicon 13' which is fully buried with a high density of diffused ions. A highly dense diffused region 15 is formed wherein field ions of the isolation elements are diffused into silicon substrate 11. The diffusion of high-concentrated diffused ions in the lateral direction in region 15 is small, since the diffusion coefficient of the ions in silicon substrate 11 is lower than the coefficient in polycrystalline silicon wherein the diffusion of ions in polycrystalline silicon in the longitudinal direction is fast. In addition, the field ions do not migrate substantially during instantanous heating with the halogen lamp.

Accordingly, preparation of an MOS device in accordance with this embodiment of the invention provides the following advantages since the patterning precision is determined by accuracy of the ion beam etching. Migration of field ions under the oxide layer which is a problem in the prior art can be completely avoided. Additionally, miniaturization of the semiconductor device can be obtained in view of the ability to miniaturization in the region of the isolating element. Moreover, the present embodiment avoids malfunction of the device due to crystal defects occasioned by an unevenness of the surface of the semiconductor substrate which is caused by thermal oxidation. Thus, an improved semiconductor device having a smooth surface is also provided.

Figure 3A:
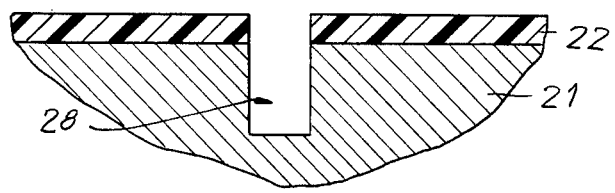
FIGS. 3(a)-(e) illustrate in cross-section the sequence of steps for preparing a polycrystalline semiconductor region and an insulating film region buried between elements in a monocrystalline semiconductor substrate in accordance with another embodiment of the invention.
Figure 3B:
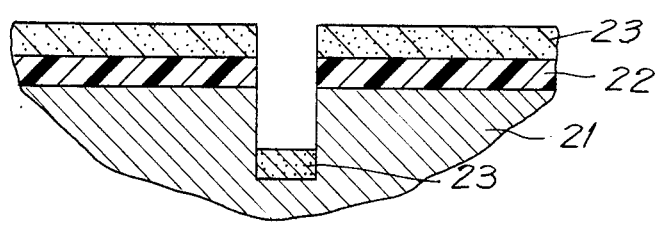
Figure 3C:
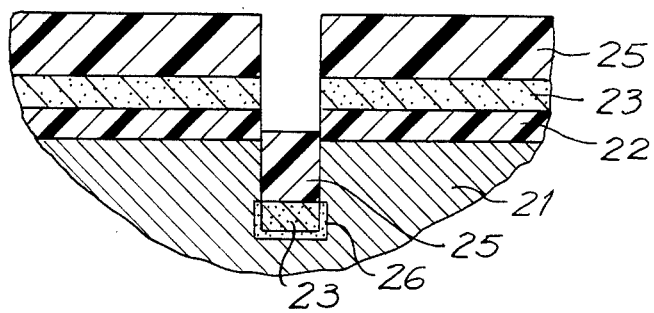
Figure 3D:
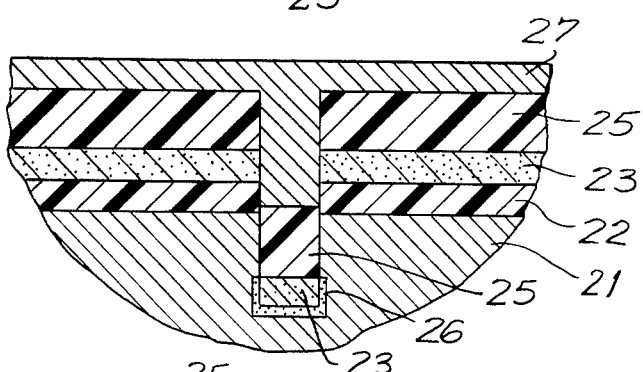
Figure 3E:
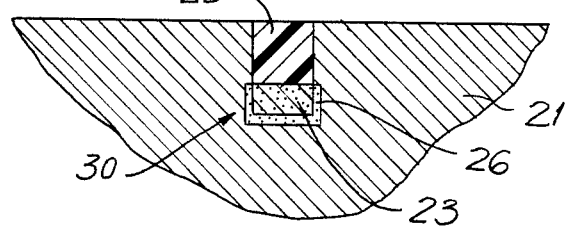

Preparation of an MOS device wherein a polycrystalline semiconductor region and an insulating film region are both buried below the surface of a monocrystalline semiconductor substrate in accordance a further embodiment of the invention is illustrated in FIGS. 3(a)-(e). FIG. 3(e) is a sectional view of the final construction of an isolation region 30 between elements of the device wherein a polycrystalline silicon layer 23 and a silicon oxide insulating film layer 25 are both submerged in isolation region 30 in a silicon substrate 21.

FIG. 3(a) illustrates a groove 28 formed by partial anisotrophy-etching or ion-etching of silicon substrate 21 which may be an n or p silicon substrate. A silicon nitride film 22 was disposed on the surface of silicon substrate 21 prior to formation of groove 28. As shown in FIG. 3(b) polycrystalline silicon 23 is deposited across silicon substrate 21, such as by chemical vapor deposition. Ion implantation illustrated by arrows 24 firms isolation region 30 between the elements of the MOS device. Silicon nitride film 22 serves to mask the surface of silicon substrate 21 outside groove 28 from being implanted during ion implantation. In the region of groove 28, a concentrated n or p diffused region 26 is formed when ions from the ion implantation diffuse into silicon substrate 21.

As shown in FIG. 3(d) a silicon oxide film 25 is formed across the entire surface of the device by chemical vapor deposition. Concentrated n or p diffused region 26 of isolation region 30 is formed when ion diffuse into silicon substrate 21. The diffusion coefficient of silicon substrate 21 is less than that of the coefficient of polycrystalline silicon wherein diffusion in the longitudinal direction is rapid. Thus, the diffusion of highly-concentrated n or p diffused silicon in the lateral direction can be controlled to a minor extent as illustrated by the small size of the diffused region 26.

A resist 27 having an etching speed equal to that of silicon oxide film 25 is formed across the entire surface of the device by spin coating as illustrated in FIG. 3(d).

Silicon oxide film 25 formed by chemical vapor deposition and resist 27 having the same etching speed are simultaneously removed by reactive ion etching as shown in FIG. 3(e). Thus, only oxide film 25 formed by chemical vapor deposition in groove portion 28 of the device remains. Polycrystalline silicon layer 23 and silicon nitride layer 22 remaining on the surface of substrate 21 are then removed. As a result, a MOS device can be provided wherein polycrystalline silicon layer region 23 and insulating silicon oxide film layer 24 formed by the chemical vapor deposition are both submerged in isolation region 30 between elements of silicon substrate 21. The final configuration of isolation region 30 between elements of the MOS semiconductor device prepared in accordance with this embodiment of the invention is as illustrated in FIG. 3(e). In accordance with this embodiment of the invention, diffusion in the lateral direction in isolation region 30 between elements can be limited.

The semiconductor devices prepared in accordance with this embodiment of the invention are advantageous. The spread of ions implanted at the isolation field between the elements can be strictly controlled to a minor extent. Thus, further miniaturization of MOS devices can be provided due to the patterning precision which is determined only by ion etching. The value of parasitic capacitance can be controlled by varying the thickness of the oxide layer formed by chemical vapor deposition. Moreover, the method in accordance with this embodiment of the invention provides an improved semiconductor device which has an even surface and any crystal defects are removed by submerging both a polycrystalline region and an insulating silicon oxide region formed by chemical vapor deposition below the surface of the monocrystalline silicon substrate.

It will thus be seen that the objects set forth above, among those made apparent from the preceding description, are efficiently attained and, since certain changes may be made in carrying out the above process and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a semiconductor device including a monocrystalline semiconductor substrate having an upper surface formed with a groove, the improvement which comprises a polycrystalline semiconductor region submerged in the groove in the substrate and below the upper surface of the substrate, said polycrystalline region being in direct contact with the monocrystalline semiconductor substrate, and an insulating film region on said polycrystalline semiconductor region and in said groove and forming a flat surface with said upper surface of the monocrystalline semiconductor substrate for forming an isolated polycrystalline region, said isolated polycrystalline region being ion implanted.

2. The semiconductor device of claim 1, wherein the polycrystalline semiconductor region and the insulating film region are both buried at an isolation region between elements of the semiconductor device.

3. The semiconductor device of claim 1, wherein the monocrystalline semiconductor substrate is a monocrystalline silicon substrate and the submerged polycrystalline semiconductor region is a polycrystalline silicon.

4. The semiconductor device of claim 3, wherein the submerged insulating film region formed on the polycrystalline silicon region is a silicon oxide region.

* * * * *